United States Patent
Van Herpen et al.

(10) Patent No.: US 7,629,594 B2
(45) Date of Patent: Dec. 8, 2009

(54) LITHOGRAPHIC APPARATUS, AND DEVICE MANUFACTURING METHOD

(75) Inventors: Maarten Marinus Johannes Wilhelmus Van Herpen, Heesch (NL); Vadim Yevgenyevich Banine, Helmond (NL); Johannes Peterus Henricus De Kuster, Heeze (NL); Johannes Hubertus Josephina Moors, Helmond (NL); Lucas Henricus Johannes Stevens, Eindhoven (NL); Bastiaan Theodoor Wolschrijn, Abcoude (NL); Yurii Victorovitch Sidelnikov, Troitsk (RU); Marc Hubertus Lorenz Van Der Velden, Eindhoven (NL); Wouter Anthon Soer, Nijmegen (NL); Thomas Stein, Oberkochen (DE); Kurt Gielissen, Meeuwen (BE)

(73) Assignee: ASML Netherlands B.V., Veldhoven (NL)

( * ) Notice: Subject to any disclaimer, the term of this patent is extended or adjusted under 35 U.S.C. 154(b) by 294 days.

(21) Appl. No.: 11/544,930

(22) Filed: Oct. 10, 2006

(65) Prior Publication Data

US 2008/0083885 A1    Apr. 10, 2008

(51) Int. Cl.
*G21K 5/00*    (2006.01)
(52) U.S. Cl. ............ 250/492.2; 250/493.1; 378/34
(58) Field of Classification Search ............ 250/492.2, 250/493.1, 504 R; 378/34
See application file for complete search history.

(56) References Cited

U.S. PATENT DOCUMENTS 6,791,665 B2    9/2004    Kurt et al.

| | | | |
|---|---|---|---|
| 2002/0148975 A1 * | 10/2002 | Kimba et al. | 250/492.1 |
| 2003/0155509 A1 * | 8/2003 | Nakasuji et al. | 250/310 |
| 2004/0190677 A1 | 9/2004 | Van Der Werf et al. | |

FOREIGN PATENT DOCUMENTS

| EP | 0957402 A2 * | 11/1999 |
|---|---|---|
| EP | 0 987 601 A2 | 3/2000 |
| EP | 1 429 189 A1 | 6/2004 |
| WO | WO 00/73823 A1 | 12/2000 |
| WO | WO 2004/053540 A1 | 6/2004 |
| WO | WO 2005/091076 A2 | 9/2005 |

OTHER PUBLICATIONS

International Search Report for International Application No. PCT/NL2007/050469 mailed Jan. 15, 2009, 5 pgs.
Wilhelmus Van Herpen et al., "Lithographic Apparatus, and Device Manufacturing Method", U.S. Appl. No. 12/405,831, filed Mar. 17, 2009.

* cited by examiner

*Primary Examiner*—David P Porta
*Assistant Examiner*—Mark R Gaworecki
(74) *Attorney, Agent, or Firm*—Sterne, Kessler, Goldstein & Fox P.L.L.C.

(57) ABSTRACT

A lithographic apparatus configured to project a patterned beam of radiation onto a target portion of a substrate is disclosed. The apparatus includes a first radiation dose detector and a second radiation dose detector, each detector comprising a secondary electron emission surface configured to receive a radiation flux and to emit secondary electrons due to the receipt of the radiation flux, the first radiation dose detector located upstream with respect to the second radiation dose detector viewed with respect to a direction of radiation transmission, and a meter, connected to each detector, to detect a current or voltage resulting from the secondary electron emission from the respective electron emission surface.

12 Claims, 6 Drawing Sheets

LITHOGRAPHIC APPARATUS, AND DEVICE MANUFACTURING METHOD

FIELD

The present invention relates to an apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Molecular contamination by, for instance, carbon on optical components in a lithographic projection apparatus (e.g. grazing incidence and multi-layer mirrors in an EUV lithographic projection apparatus) may be a problem. For example, contamination of reflective elements in an EUV lithographic projection apparatus may be caused by the presence of hydrocarbons and electrons that are generated by EUV illumination. A further problem may be how to monitor the dose of radiation from a source and the amount of contamination that gathers on an optical component.

SUMMARY

A lithographic projection apparatus may be provided wherein an object (e.g., an optical element) situated in a pulsed beam of radiation has an electrode in its vicinity and a voltage source connected either to the electrode or to the object. The source may provide, for example, a negative voltage pulse to the object relative to the electrode. The beam of radiation and the voltage pulse from the voltage source are provided in phase or out of phase. In this way, the object is shielded against secondary electrons generated by the radiation beam. A measuring device configured to measure the current generated by secondary electrons in the electrode may be provided. The dose of radiation from a source and the amount of contamination that gathers on the body may be monitored by measuring the electron flux from the body. An amount of secondary electrons collected may be a measure for the dose of radiation and the amount of contamination. The measurement may be easily determined using a current measuring device connected to the electrode or the object.

One or more embodiments of the present invention include an improved lithographic apparatus wherein contamination can be detected accurately, in a relatively simple manner.

According to an embodiment, there is provided a lithographic apparatus configured to project a patterned beam of radiation onto a target portion of a substrate, the apparatus comprising:

a first radiation dose detector and a second radiation dose detector, each detector comprising a secondary electron emission surface configured to receive a radiation flux and to emit secondary electrons due to the receipt of the radiation flux, the first radiation dose detector located upstream with respect to the second radiation dose detector viewed with respect to a direction of radiation transmission; and a meter, connected to each detector, to detect a current or voltage resulting from the secondary electron emission from the respective electron emission surface.

According to an embodiment, there is provided a lithographic apparatus configured to project a patterned beam of radiation onto a target portion of a substrate, the apparatus comprising:

a radiation dose detector substantially insensitive to a contaminant that is likely to contaminate the detector during operation of the apparatus, the detector comprising a secondary electron emission surface configured to receive a radiation flux, and which may also receive the contaminant, and to emit secondary electrons due to the receipt of the radiation flux, the surface substantially made of the contaminant or a material with a secondary electron emission similar to that of the contaminant; and a meter, connected to the surface, to detect a current or voltage resulting from the secondary electron emission.

According to an embodiment, there is provided a lithographic apparatus configured to project a patterned beam of radiation onto a target portion of a substrate, the apparatus comprising:

a radiation dose detector sensitive to a contaminant that is likely to contaminate the detector during operation of the apparatus, the detector comprising a secondary electron emission surface configured to receive a radiation flux, and which can also receive the contaminant, and to emit secondary electrons due to the receipt of the radiation flux, the detector positioned to receive a contaminant emanating from the substrate during operation; and a meter, connected to the detector surface, to detect a current or voltage resulting from the secondary electron emission.

According to an embodiment, there is provided a lithographic apparatus configured to project a patterned beam of radiation onto a target portion of a substrate, the apparatus comprising:

a radiation dose detector sensitive to a contaminant that is likely to contaminate the detector during operation of the apparatus, the detector comprising a secondary electron emission surface configured to receive a radiation flux, and which can also receive the contaminant, and to emit secondary electrons due to the receipt of the radiation flux, the detector positioned to receive a contaminant emanating from the substrate during operation; and a meter, connected to the detector surface, to detect a current or voltage resulting from the secondary electron emission.

According to an embodiment, there is provided a lithographic apparatus configured to project a patterned beam of radiation onto a target portion of a substrate, the apparatus comprising:

an etch detector comprising a detector body having a secondary electron emission surface, the surface configured to receive a radiation flux and to emit secondary electrons due to the receipt of the radiation flux, wherein the composition of the detector body varies in a direction perpendicular from the surface;

a meter, connected to the detector body, to detect a current or voltage resulting from the secondary electron emission; and a data processor configured to detect etching of the detector from the measurement by the meter.

According to an embodiment, there is provided a lithographic method, comprising:

projecting a patterned beam of radiation onto a target portion of a substrate; and detecting a radiation dose utilizing a radiation dose detector substantially insensitive to a contaminant that is likely to contaminate the detector during operation of the apparatus, the detector comprising a secondary electron emission surface substantially made of the contaminant or a material with a secondary electron emission similar to that of the contaminant, wherein radiation received by the surface results in emission of secondary electrons from the surface and a current or voltage resulting from the secondary electron emission is detected, the current or voltage being independent of the presence of the contaminant on the surface.

According to an embodiment, there is provided a method to clean (for example by removing a layer of contaminants) a surface of an optical component, the method comprising:

subjecting the surface to a cleaning treatment; and monitoring the surface by irradiating the surface such that secondary electrons are emitted by the surface and detecting a resulting secondary emission voltage or current.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
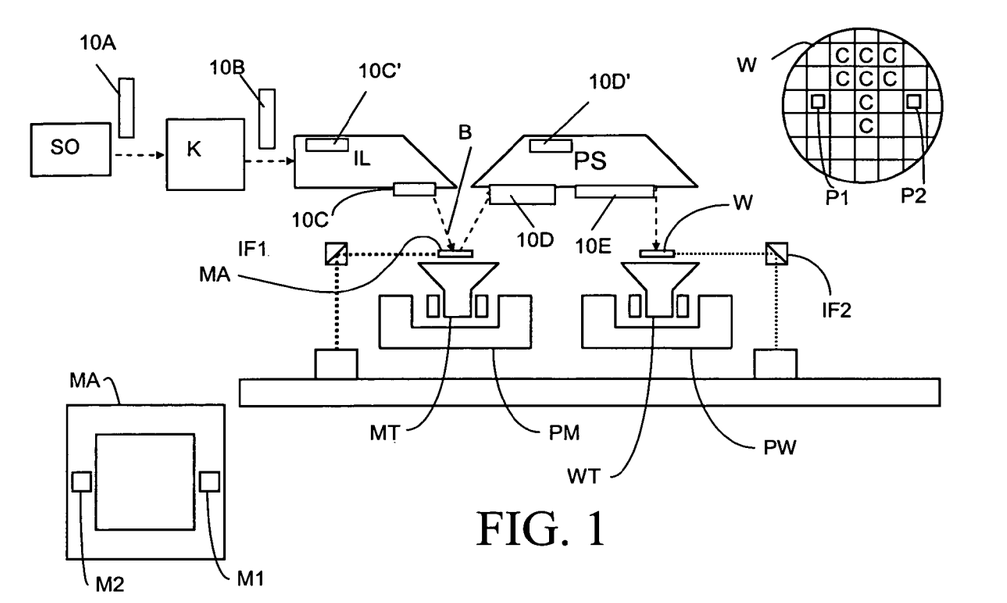
FIG. 1 depicts an embodiment of a lithographic apparatus.

FIG. 1 schematically depicts a lithographic apparatus according to one embodiment of the invention. The apparatus comprises:

an illumination system (illuminator) IL configured to condition a radiation beam B (e.g. UV radiation or other types of radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

In an embodiment, the radiation source is a plasma EUV source, for example a tin (Sn) plasma EUV source. For example, in such a radiation source, atoms can be heated (e.g., electrically) using a low power laser, or in a different manner. The EUV radiation source may also be a different radiation source, for example a Li or Xe 'fueled' plasma radiation source. Also, during use, small amounts of plasma may escape from the source SO, towards a collector K and the illuminator IL. The collector K collects radiation from the radiation source SO and is arranged to transmit the collected radiation to the illumination system IL. Particularly, the collector K may be arranged to focus incoming radiation, received from the radiation source, onto a small focus area or point.

The illuminator IL may comprise an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT and is patterned by the patterning device. Being reflected on the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
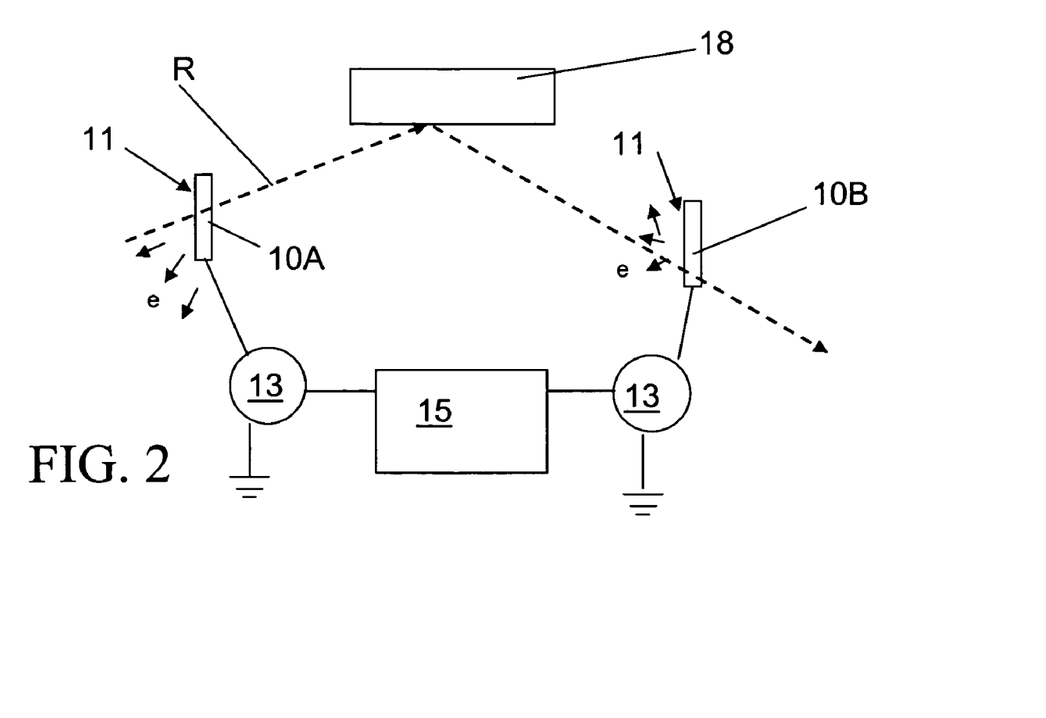
FIG. 2 schematically depicts an embodiment of a dose and/or contamination detection system.

FIG. 2 schematically depicts part of an embodiment of a lithographic apparatus, for example an apparatus as described above. In the FIG. 2 embodiment, the apparatus comprises a first radiation dose detector 10A and a second radiation dose detector 10B (although more detectors may be provided). Each of the detectors 10 comprises a secondary electron emission surface 11, the surface 11 being configured to receive a radiation flux and/or contamination, and to emit secondary electrons (depicted by arrows e) due to receipt of radiation flux. Particularly, the emission surface 11 is configured to receive a radiation flux and contamination at the same time, during use. The radiation flux (or radiation) is schematically indicated by broken line R, and may be the above-described radiation beam or a part thereof (emanating from the radiation source SO). As a non limiting example, the radiation beam may be a beam of EUV radiation.

In an embodiment, the surface part of each detector surface 11 that intersects or receives the radiation flux R is relatively small, so that the detectors 10 do not substantially hinder overall transmission of the radiation. For example, each detector 10 may be a small object, pin, wire element or other suitable detector structure, which may be located in the path of the radiation flux R. In a simple embodiment, each detector 10 may be in a fixed position, for example, firmly mounted to a frame of the apparatus. Alternatively, the detectors 10 may be provided with a mechanism to move the detectors 10 into and out of the path of the radiation flux R, to detect radiation in desired measuring periods. Each detector surface 11 may have any of a various number of shapes, such as a plane or curved shape.

The detector surface 11 may comprise any of various materials suitable to provide the secondary electron emission, as will be appreciated by the skilled person. In a an embodiment, the detectors 10 may be located in an environment where it is known that one or more types of contaminants might be present therein. In that case, it is advantageous if the detector surfaces 11 also comprise or consist of the same contaminant (s) before use, so that electron emission will not be significantly influenced by further detector contamination with the contaminant(s) during use. For example, in the case that carbon (C) contamination might be present during use near the detector surfaces 11, these surfaces 11, in an embodiment, may already comprise or consist of carbon material. In the case that one or more metal contaminants (for example, tin) might be present in the detector environment, the detector surfaces 11, in an embodiment, may already comprise or consist of the same metal contaminant (for example, tin). As a further example, in an embodiment, a detector structure 10 might comprise or consist of an expected contaminant material, or be coated with such material. In an embodiment, the surfaces 11 of the detectors 10 are made of the same material (s), although this is not essential.

In the present embodiment, two current (or voltage) meters 13 are provided, and are directly or indirectly connected to the detector surfaces 11 in a suitable manner, to detect currents (or voltage, e.g., voltage difference) resulting from the secondary electron emission from each of these surfaces 11. The meters 13 (or 'secondary electron meters') may be coupled to the detectors 10 in a way, such that secondary electron emission from the respective detector surface 11 results in a current (or voltage) that can be detected by the meter 13. For example, each meter 13 may simply be grounded, so that ejection of electrons from the emission surface 11 may be compensated via the meter 13 from ground. Each meter 13 as such may be configured in various ways, and may be designed to detect an electrical signal relating to the secondary electron emission (for example, current) directly or indirectly. As an example, the meter 13 may comprise a resistor, wherein the secondary electron emission can simply be measured from the current flowing through the resistor. Also, the meter may comprise or be a voltage meter, for example to measure a voltage across the above-mentioned resistor, the voltage being indicative of the secondary electron emission.

In an embodiment, the first radiation dose detector 10A is located upstream with respect to the second radiation dose detector 10B, viewed with respect to a direction of radiation transmission. Advantageously, an optical component 18 of the apparatus is located between the first and second radiation dose detectors 10A, 10B, viewed in a radiation transmission direction, such that the radiation can first be detected by the first radiation dose detector 10A, then reaches the optical component 18 and after that can be detected by the second radiation dose detector 10B. In other words, the first detector 10A is located upstream with respect to the optical component 18, and the second detector 10B is located downstream with respect to the optical component 18. In an embodiment, the detectors 10A, 10B are located near the respective optical component 18. Each detector 10A, 10B may be arranged in a respective line of sight of part of the optical component 18, for example a part of the optical component 18 that is to receive, reflect, absorb and/or transmit at least part of the radiation flux R.

The optical component 18 may include any of various component types. In the present application, the term "optical component" may include one or more selected from the following components 18: a mirror, a lens, a collector, a filter, a mask, an illumination system, or energy sensitive device or sensor (e.g. to detect radiation to provide energy and/or intensity measurements). The optical component (and particularly one or more optical surfaces thereof) may be configured to direct, shape, or control the radiation, or to detect the radiation. For example, the optical surface of the respective optical element/component may be a radiation reflecting surface (in the case of a mirror element), a transmissive surface, or a surface having radiation absorbing parts. As an example, indicated in FIG. 1, there may be provided a pair of radiation dose detectors 10A, 10B to detect radiation upstream and downstream with respect to a collector K. Also, there may be provided a pair of radiation dose detectors 10B, 10C to detect radiation upstream and downstream with respect to an illumination system IL. Similarly, a pair of radiation dose detectors 10C, 10D may be implemented to detect radiation upstream and downstream with respect to a patterning device MA. Moreover, a pair of radiation dose detectors 10D, 10E may be provided to detect radiation upstream and downstream of a projection system PS. It will be clear that a single optical component 18, or a group of optical components, and at least one upstream and at least one downstream radiation dose detector 10 may be associated with each other.

There may be provided a data processor 15 which is configured to compare measurement results of the meters 13 to detect a change in radiation received by the upstream and downstream radiation dose detectors 10A, 10B. The data processor 15 may be configured in any of various ways and may be connected to the meters 13 by suitable wiring, communication lines, and/or wirelessly (see FIG. 3), to receive measurement results from the meters 13. As an example, the data processor may include suitable hardware, software, a computer, microcontroller, microelectronics, and/or one or more data processing modules as will be appreciated by the skilled person. For example, the data processor 15 may comprise a memory to store the measurement results, for example continuously or at certain time intervals. During operation, new measurement results may be compared with previous, stored, results, particularly to track and/or detect changes in the secondary electron emission measurements of the two detectors 10A, 10B, which changes might indicate malfunctioning or contamination of the intermediate optical component 18 or intermediate group of optical components.

In an embodiment, the data processor may compare measurement results of the meters 13 during a certain operational period of the apparatus. In this way, radiation losses due to degeneration of the optical component 18 may be detected in a simple but very accurate manner, using inexpensive means. In an embodiment, in case a certain threshold of degeneration of the optical component 18 is determined, a suitable message or alarm may be generated, for example to alert an operator that the optical component should be replaced or cleaned.

The data processing of the measurement results may include various operations. For example, initial meter measurement results relating to secondary electron emission from the detector surfaces 11 when the optical component 18 is not degenerated (for example contaminated) may be stored and used subsequently to determine any subsequent changes in the meter measurement results that may indicate optical component degeneration. As an example, in the case that the measurement relating to electron emission from the second detector 10B shows a much larger drop, with respect to the respective initial value, than the measurement relating to electron emission from the first detector 10A, this may indicate radiation transmission loss due to degradation of the optical component 18. For example, during operation, the data processor 15 may simply determine the ratio of the current measurements of the two meters 13, and compare that ratio with an initial measurement ratio to determine radiation transmission loss between the detectors 10A, 10B. For example, in an embodiment, a change in the ratio of radiation received by the radiation dose detectors may be determined (for example by the data processor 15).

For example, during operation, a radiation flux R is directed to the optical component 18 (for example intermittently, in case of radiation pulses) and is transmitted to the downstream detector 10B, resulting in secondary electron emission from the surface 11 of that detector 10B which is measured by the respective meter 13. Contamination of the optical component 18 may lead to a loss of radiation transmission to the downstream detector 10B, resulting in a decrease of the secondary electron emission. A resulting decrease of the meter measurement result, relating to the secondary electron emission from the second detector 10B, might be used as evidence of the contamination of the optical component 18, but is not accurate due to the possibility that the downstream detector 10B itself might be contaminated also and additionally because the intensity of the radiation flux R may vary in time. In a worst case, only the downstream detector 10B is contaminated, leading to loss of secondary electron emission from the respective surface 11, and not the optical component 18, so that a false alarm might be generated. Thus, a much more precise monitoring is provided, by taking into account secondary electron emission of the upstream detector 10A as well (the upstream detector 10A also receives the radiation flux R during use), as is explained above. Moreover, in the present embodiment, transmission loss concerning an optical component 18 may be detected without the respective optical component 18 being part of the radiation flux detector.

Figure 3:
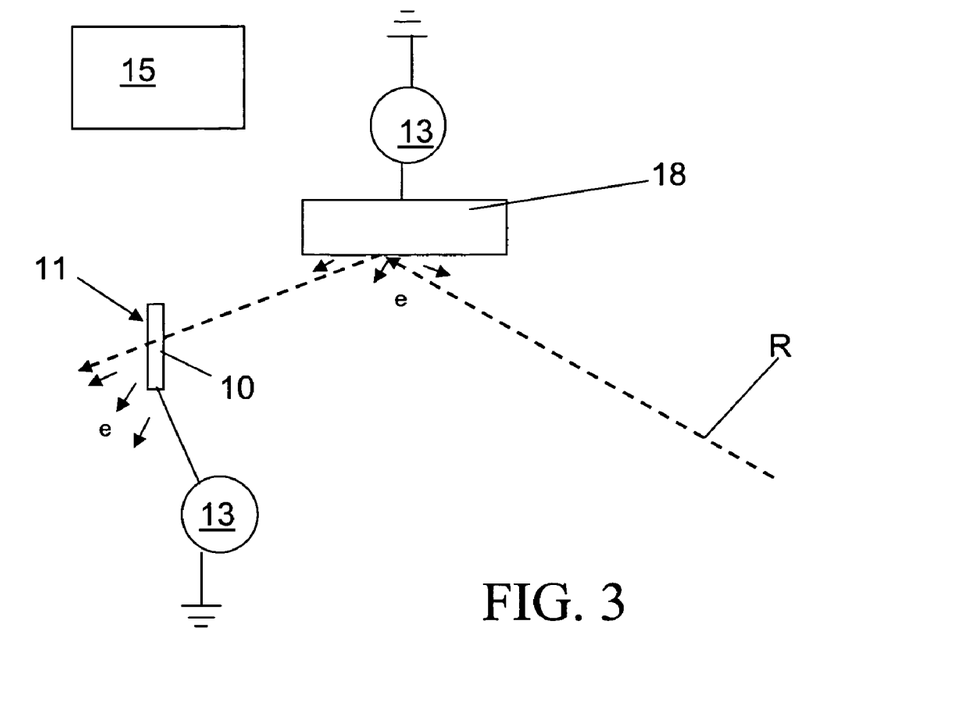
FIG. 3 schematically depicts another embodiment of an energy and/or contamination detection system.

FIG. 3 depicts another embodiment comprising an upstream and downstream detector. In this case, the optical component 18 is the upstream detector, the surface which can emit secondary electrons when the surface receives the radiation flux. The optical component 18 is coupled to a meter 13 to detect the respective current (or voltage) resulting from the secondary electron emission. Also, a downstream secondary electron emission radiation flux detector 10 is provided (as in the FIG. 2 embodiment). The operation of the FIG. 3 embodiment may be substantially the same as that of the FIG. 2 embodiment, with the difference being that the optical component 18 is now used as one of the two radiation dose detectors, instead of the first detector 110A shown in FIG. 2. Herein, for example, the measurement results of secondary electron emission from the separate detector 10 may be used to verify such measurement results of secondary electron emission from the optical component 18, for example to detect contamination of the optical component. Also, in this case, the separate detector 10 and optical component 18 may have secondary electron emission surfaces made of the same material(s), to provide a similar sensitivity to contaminants.

During an experiment regarding the above-described secondary electron emission, in the situation of irradiation of a mirror or other conductive surface with EUV, it was found out that a) the secondary emission scales linearly with input EUV power, and b) only the top layer of the irradiated body has significant influence on the secondary electron emission and so the secondary electron emission virtually does not depend on material extending below the top layer.

The above-described detector 10 may be used as, for example, an energy sensor. In that case, the detector surface material may be matched with expected contamination at a certain position in the apparatus. For example, near a radiation source which may produce Sn contamination, the detector surface may be made of Sn or SnOx. Where, for example, there is a carbonizing environment in the optical train of the apparatus, the detector 10 may have a surface layer of, or contain, a natural carbon. For example, when the surface of one or more mirrors may be used as a sensor, then the surface may be carbonized.

Thus, in an embodiment, there may be provided a contaminant-insensitive radiation dose detector 10, 18 being substantially insensitive to a contaminant that is likely to contaminate the detector during operation of the apparatus, the contaminant-insensitive detector 10, 18 being provided by a secondary electron emission surface, configured to receive a radiation flux and which may also receive the contaminant, and configured to emit secondary electrons due to the receipt of the radiation flux, wherein the detector surface is substantially made of the contaminant, or a material with a secondary electron emission similar to that of the contaminant. As an example, the surface may be the surface of a radiation reflector 18. The contaminant may be, for example, carbon, tin, tin oxide, zinc, zinc oxide, manganese, manganese oxide, tungsten, and/or tungsten oxide.

Thus, during use, a lithographic method may comprise projecting a patterned beam of radiation onto a target portion of a substrate and detecting a radiation dose utilizing a contaminant-insensitive radiation dose detector 10. In that case, radiation may be received by the detector surface 11, resulting in emission of secondary electrons from that surface, wherein a current or voltage resulting from the secondary electron emission is detected, the current or voltage being independent of the presence of the contaminant on the detector surface.

As will be explained below, the detector 10 may be used to monitor a cleaning process.

Thus, a very simple sensor principle is provided, which is not sensitive to deterioration and thus may be used in monitoring of energy, contamination and/or cleaning. The sensor is flexible and cheaper than, for example, a diode sensor system.

Figure 4:
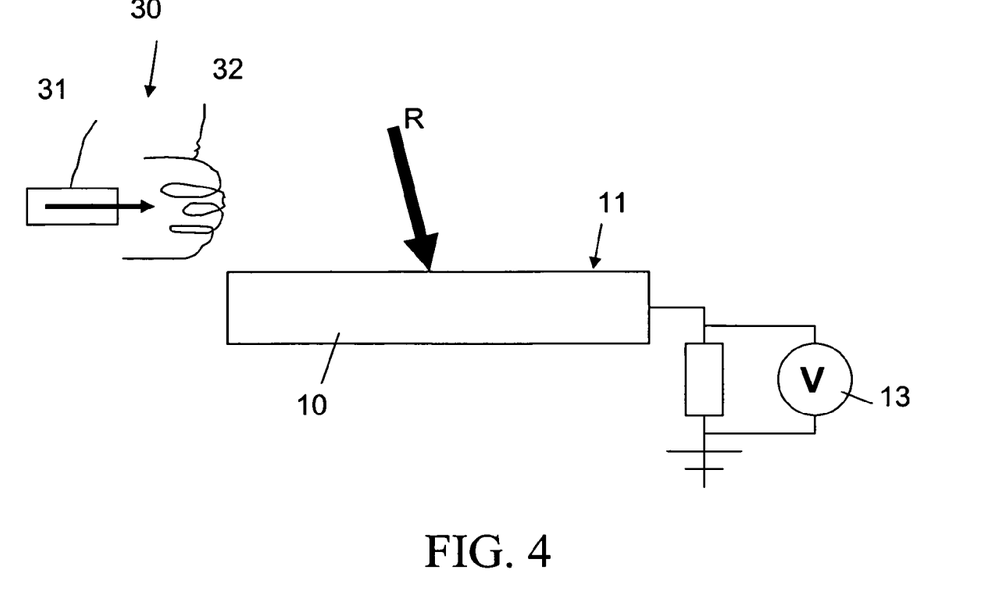
FIG. 4 schematically depicts a further embodiment of an energy and/or contamination detection system.

FIG. 4 shows another embodiment, which may be combined with one or more of the above-described embodiments, if desired. In the FIG. 4 embodiment, the lithographic apparatus comprises a contaminant sensitive radiation dose detector 10, being sensitive to at least one contaminant that is likely to contaminate the detector during operation of the apparatus. The detector 10 comprises a secondary electron emission surface 11 configured to receive a radiation flux R and which may also receive the contaminant, and configured to emit secondary electrons due to the receipt of the radiation flux. Further, a meter 13 is connected to the detector surface 11 to detect a current or voltage resulting from the secondary electron emission. Further, the apparatus is provided with a cleaning system 30 to remove contamination from the detector surface and optionally from, for example, a nearby optical component (not depicted in FIG. 4).

The cleaning system 30 provides an advantage that contamination may be removed from the detector surface 11. This cleaning system is particularly advantageous when the detector 10 is used to measure contamination, which means, that after it has become contaminated, it should be cleaned.

For example, the cleaning system 30 may comprise an inlet 31 for hydrogen gas and a device 32 to generate hydrogen radicals (such as a hot filament, or a RF field).

According to an embodiment, the cleaning system may be configured to carry out a method comprising providing $H_2$ containing gas in at least part of the apparatus, producing hydrogen radicals from $H_2$ from the $H_2$ containing gas, and having the detector surface 11 come into contact with at least part of the hydrogen radicals to remove at least part of a deposition from that surface. As an example, the deposition may comprise one or more elements selected from B, C, Si, Ge or Sn. At least part of the hydrogen radicals may be generated from $H_2$ from the $H_2$ containing gas by a filament, a plasma, radiation, or a catalyst configured to convert $H_2$ into hydrogen radicals. The $H_2$ containing gas may further comprise a halogen gas.

In an embodiment, the detector 10 may be used as a cleaning monitor, wherein cleaning of the detector surface 11 provides an indication of progress of the cleaning of the nearby optical component. As part thereof, the above-described cleaning method may be carried out on the optical component and/or on the detector 10.

In an embodiment, the cleaning system 30 may be designed to clean part of a nearby optical component, e.g. via hydrogen (H) cleaning to remove carbon (C) from the optical component. In that case, the detector surface 11 may comprise a layer of contaminant on top of a layer of a different material than the expected contaminant. During the cleaning process, a step in the secondary emission signal of the detector 10 is expected after a deposited contaminant (e.g. natural carbon or Sn) has been removed from the detector surface and the pure surface material is exposed.

The step may also provide an indication of the amount of cleaning of a nearby optical component. For example, the detector 10 may be arranged, with respect to the optical component, such that the detector surface 11 and the optical component may receive substantially the same level of contamination during operation. Also, the detector 10, optical component and cleaning system 30 may be arranged such that the cleaning process leads to substantially equal cleaning rates of the detector surface 10 and optical component. Then, a detected completed detector cleaning may provide an indication that the optical component 10 has reached a desired cleaned state as well.

A system comprising a detector 10 and cleaning system 30 may be located in any of various parts of, or associated with, the lithographic apparatus, for example near the source SO, collector K, illumination optics, and/or projection optics. The apparatus may be provided with one or more cleaning devices to clean one or more optical components. For example, the cleaning device may be movable between various positions in the apparatus to clean various parts.

Figure 5:
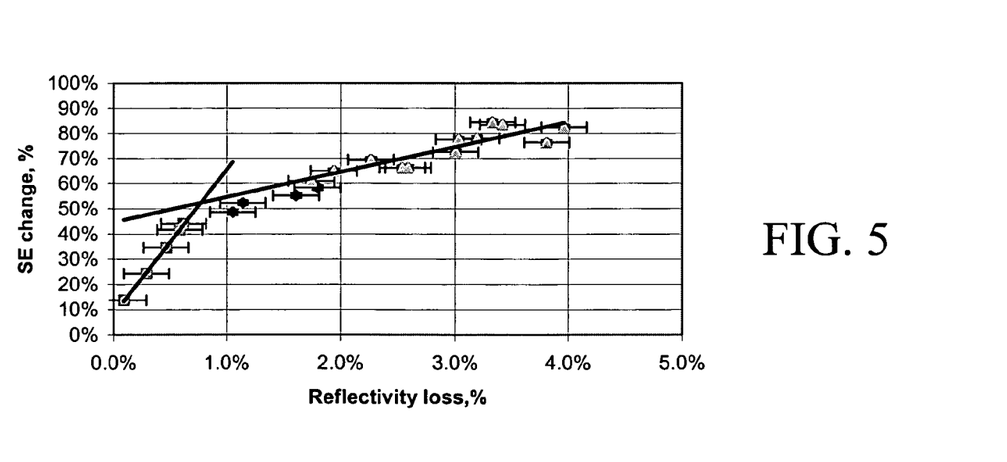
FIG. 5 schematically depicts results of an experiment.

In an embodiment, the detector surface 11 substantially comprises Ruthenium (Ru). Accurate measurements may be obtained in this manner. For example, FIG. 5 shows the results of an experiment or simulation wherein a multi-layer mirror was used as the detector 10. The mirror was a Ru-capped multi-layer mirror. A thin layer of carbon (C) was grown onto this mirror (as will occur in carbon contamination), while measuring the SE (secondary electron emission) signal of the mirror/detector and EUV reflectivity of the mirror surface. In FIG. 5, it can be seen that while making a transition from a desired clean Ru top surface to a 'contaminated' top surface, the SE signal changes significantly and promptly, by 50% on the first 1% EUV reflectively loss (equal to or approximately 2 nm C). Thus, if linearity is assumed then the accuracy of the detector is in the order of 0.25% SE signal accuracy=0.005% reflectivity loss, which corresponds to a carbon thickness of about 0.01 nm (C mono-layer is about 0.1-0.2 nm). Thus, a Ru detector surface 11 may provide a very sensitive detector concerning, for example, carbon contamination.

Where the detector surface 11 substantially comprises Ruthenium (Ru), small quantities of contamination growing on optics, for example an EUV mirror, may be detected, before the contamination becomes a problem for the optics. Generally, a mono-layer or smaller of contamination may be detected.

For example, in an EUV lithography environment, mirrors become contaminated due to several reasons, such as Sn debris from an EUV source, carbon growth from EUV illumination and outgassing of EUV resist. Since EUV optics are highly sensitive to contamination (1 nm of contamination may already be unacceptable), it is important to be able to monitor the growth rate of contamination. As follows from the above, a solution is to measure secondary emission (SE) from, for example, a Ru detector surface 11.

In an embodiment, there is provided a method to clean a surface of an optical component (for example to remove a layer of contaminants), comprising subjecting the surface to a cleaning treatment, and monitoring the surface by irradiating the surface such that secondary electrons are emitted by the surface and detecting a resulting secondary emission current or voltage. Via the monitoring, for example, it may be determined whether the cleaning works and when the cleaning is complete. Thus, a relatively simple and accurate method is provided to monitor the cleaning process of an optical component, wherein the optical component provides the above-mentioned secondary electron emission surface 11.

Figure 6:
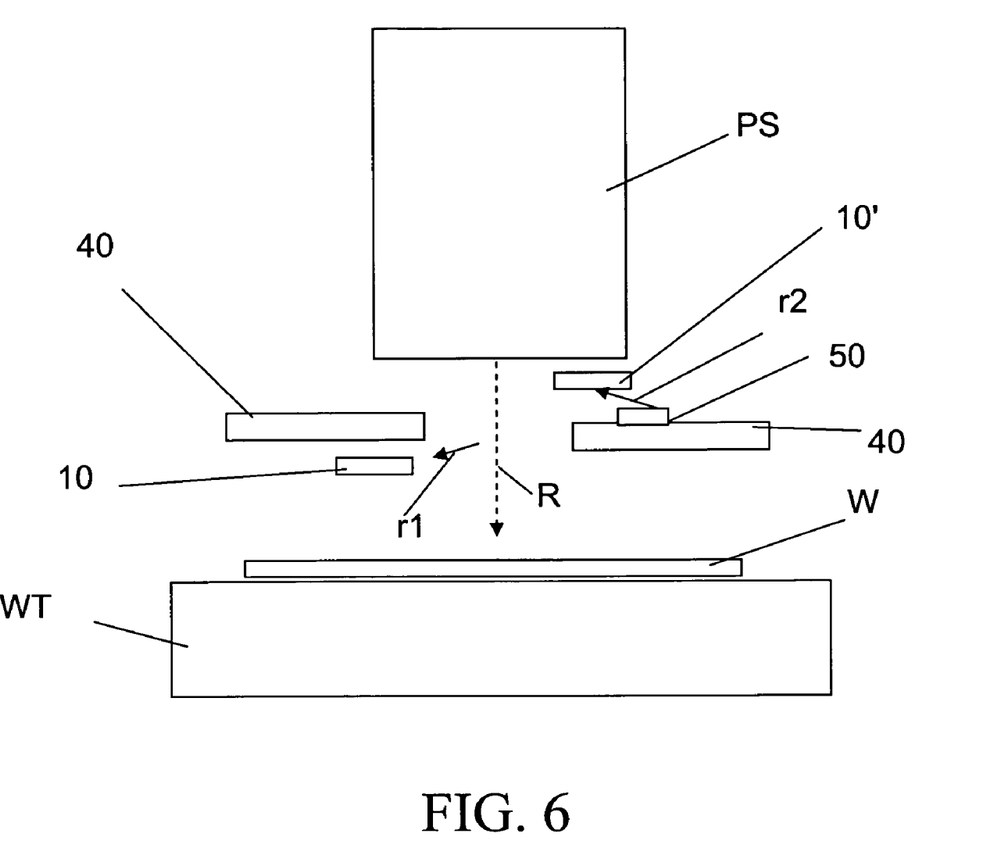
FIG. 6 schematically depicts another embodiment of an energy and/or contamination detection system.

According to another embodiment, part of which is schematically shown in FIG. 6, there is provided a lithographic apparatus configured to project a patterned beam of radiation onto a target portion of a substrate W, the apparatus comprising a contaminant sensitive radiation dose detector 10, 10' sensitive to a contaminant that is likely to contaminate the detector during operation of the apparatus, the detector 10, 10' comprising a secondary electron emission surface configured to receive a radiation flux and which may also receive the contaminant, and configured to emit secondary electrons due to the receipt of the radiation flux, wherein a meter (not depicted in FIG. 6) is connected to the detector surface to detect a current or voltage resulting from the secondary electron emission. In this case, the detector is positioned to receive a contaminant emanating from the substrate W during operation, as is depicted in FIG. 6.

In an embodiment, the apparatus may comprise a projection system PS to project the radiation beam onto the substrate W, and a gas shower 40 to provide a gas curtain between the substrate W and the projection system PS. The gas shower 40 as such is known to the skilled person, and may be configured in various ways. Particularly, one or more gas showers may be configured to shield the downstream part of the projection system from the substrate zone, using one or more suitable gas flows. For example the gas shower(s) 40 may be configured to substantially prevent contamination originating from the substrate W to reach the projection system PS.

In an embodiment, the above-described radiation dose detector 10, 10' may be located in at least one of the following locations: between the substrate and projection system, in the gas curtain, between the gas curtain and the substrate, or between the gas curtain and the projection system.

Two examples of the positions of a radiation dose detector 10, 10' are indicated in the FIG. 6, a first detector 10 being located in a region between the substrate table WT and gas shower(s) 40, and a second detector 10' being located in a region between the projection system PS and gas shower(s) 40.

For example, the detector 10 may be used to be able to monitor the amount of contamination induced by resist on the substrate W. In this embodiment, the amount of contamination due to resist outgassing (for example hydrocarbons, Si-hydrocarbons, F-hydrocarbons) from the substrate W may be monitored. For this purpose, as follows from FIG. 6, the detector 10 may be placed in close proximity to the substrate W.

Sometimes, one may accidentally use a bad type of resist that evaporates too much material, resulting in a rapid growth of contamination on the EUV optics. It is advantageous if a sensor would be able to detect this in an early stage, such that an alarm may be given to stop the use of a particular substrate or a particular type of resist. In the EUV tool, a gas curtain may be used directly above the substrate, in order to prevent particles originating from the resist from reaching the EUV optics. However, in some cases this gas curtain may not be efficient enough, especially if a bad resist is used.

In the case the detector 10 is placed between the substrate W and the gas curtain 40, the detector is desirably closest to the contamination source (i.e. substrate W) and will thus be the most sensitive. Typically, the suppression of contaminants by the gas curtain is 4 orders of magnitude, thus the sensitivity of the detector with respect to contamination process on the projection optics PS behind the gas curtain may be enormous.

In another example, a detector 10' be placed directly behind the gas curtain. An advantage of this location is that the detector is partially protected from contamination by the gas curtain, and the detector is located in same area where the EUV optics are.

Also, for example, the detector 10 may be spaced-apart from a substrate table WT or gas shower 40. Alternatively, for the detector 10 may be integrated with a substrate table WT or gas shower 40. When the detector 10 is placed somewhere within the gas curtain, it may be used in order to tune the accuracy of the detector to a desired value.

As is shown in FIG. 6, illumination/irradiation of the detector 10, 10' may be stray radiation r1 of the EUV beam used for operation of the tool, or radiation r2 emitted by an alternative low power source 50 (schematically depicted in FIG. 6), or another wavelength small enough to create photo-electrons. Alternatively or additionally, the detector 10, 10' may be arranged to detect at least part of the EUV beam directly.

In an embodiment, there may be provided an above-described radiation dose detector 10A, 10B, 10F, 80 (see FIGS. 1 and 7) to monitor debris emanating from a radiation source SO of or associated with the apparatus. As follows from the above, the detector may be provided by a secondary electron emission surface 11, configured to receive a radiation flux and optionally contamination, and to emit secondary electrons due to the receipt of the radiation flux, wherein a meter is connected to the detector 10A, 10B, 10F, 80 to detect a current or voltage resulting from secondary electron emission from the electron emission surface 11.

For example, in addition to radiation (for example, EUV radiation), a radiation source SO typically generates debris. For example, an Sn-based EUV source will generate Sn particles, which travel further downstream into the EUV system. In order to block these particles, a debris mitigation system may be employed, using for example a foil trap FT and a buffer gas. At some stage, these components may also be cleaned using a Sn cleaning method such as halogen cleaning or hydrogen cleaning.

Figure 7:
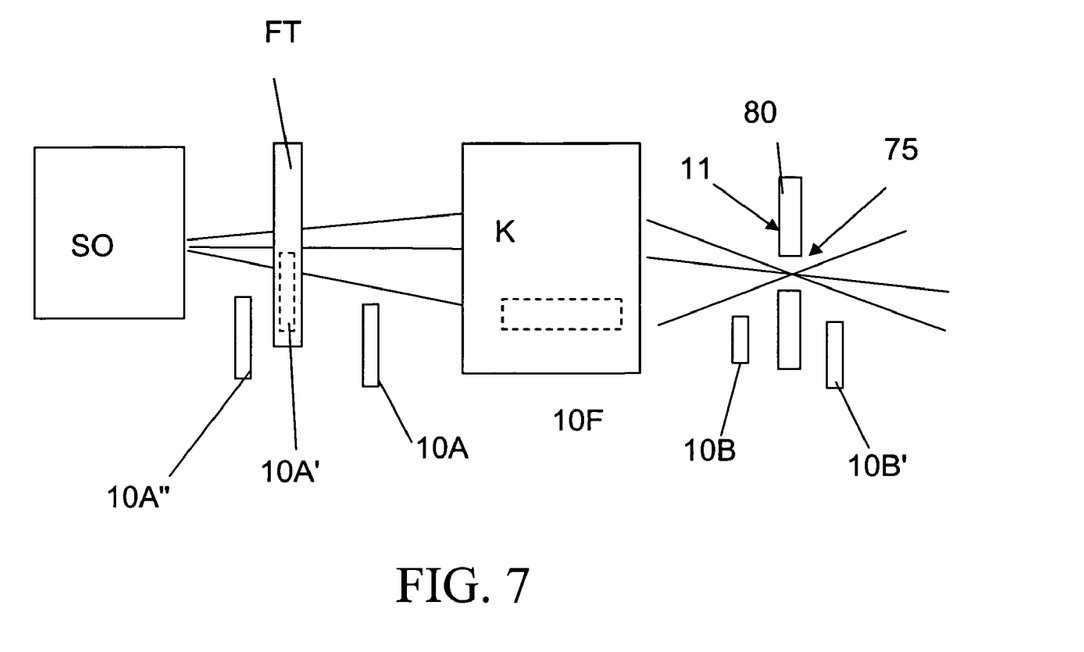
FIG. 7 schematically depicts a further embodiment of an energy and/or contamination detection system.

Even though most source related contaminant particles are blocked by the debris mitigation system, some source debris may still travel further into the apparatus. Thus, it is important to monitor the amount of contamination near the radiation source SO. For example, in order to monitor Sn contamination, a detector 10A may be placed, for example, near a (first) intermediate focus 75 (either behind, or directly before) downstream with respect to the source SO.

In an embodiment, an aperture 80 may be present at the intermediate focus 75 downstream of the source SO, for example to block radiation that cannot be projected due to etendue limits. This aperture 80 will be partially illuminated by the radiation (for example EUV), and may thus be used to measure secondary emission and thus contamination growth. For example, as is depicted by FIG. 7, at least part of a surface of an aperture component 80 of the apparatus may be provided with the above-described secondary electron emission surface 11, wherein a meter 13 may be arranged to measure a secondary electron emission current or voltage.

Alternatively or additionally, for example, a separate secondary electron emission surface 11 may be located directly in front or alternatively behind the intermediate focus 75. As an example, in FIG. 7, a detector 10B is located in front of the aperture 80 as well as another or alternative detector 10B' behind the aperture 80.

Additionally or alternatively, a detector 10F (or at least a detector surface 11) may be placed somewhere within a radiation collector K, or be part of the collector K, as is depicted with broken lines. Similarly, a detector 10A' (or at least a detector surface 11) may be placed somewhere within a foil trap FT, or be part thereof. Similarly, a detector 10A" may be located between a foil trap FT and a source SO, directly looking at the source SO, and/or a detector 10A may be between a foil trap FT and a collector K.

In an embodiment, contamination growth may be monitored near the projection optics PS and illumination optics IL of the lithography system. Typically, in that case, contamination may be hydrocarbons, but also Sn debris or oxidation may be important here (due to for example a temporary loss of the vacuum specifications, or a leak in the vacuum system). In order to monitor this contamination growth, one or more of the above-mentioned detectors 10C, 10C', 10D, 10D' is/are placed within or near the projection optics PS and/or the illumination optics IL (see FIG. 1), for example within part of the radiation beam.

Figure 8:
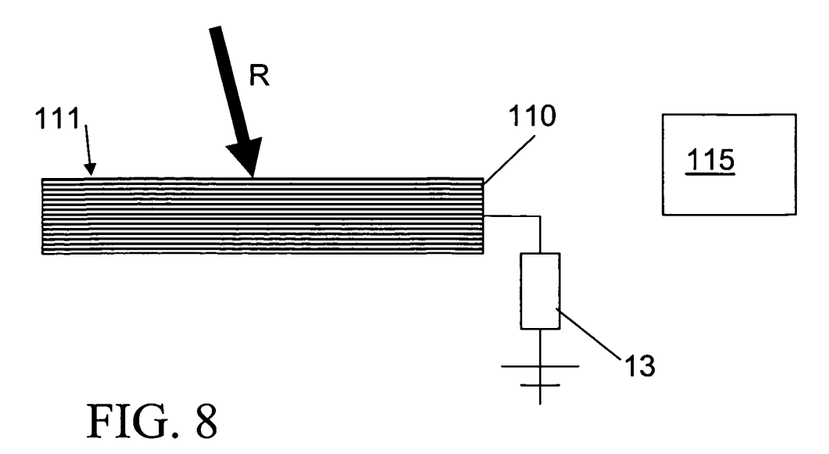
FIG. 8 schematically depicts an embodiment of an energy and/or contamination detection system.
Figure 9:
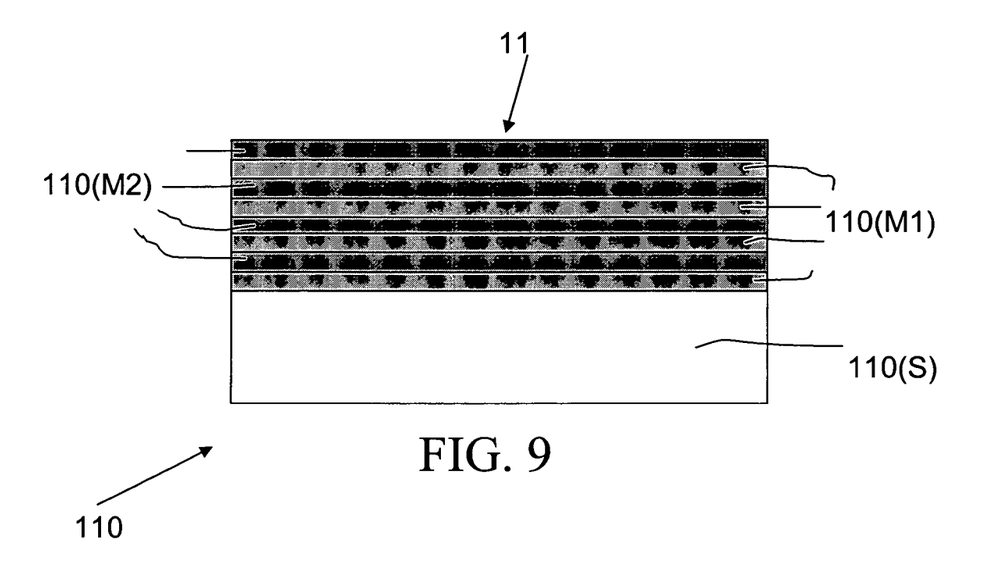
FIG. 9 schematically depicts a detail of the embodiment of FIG. 8.

The embodiment of FIGS. 8 and 9 may provide a simple way to monitor an amount of ion-induced sputter etching that may occur in, for example, an EUV environment. Herein, as follows from the above, a current or voltage induced by secondary electron emission from a multi-layer structure, is monitored, for example by the data processor 115. By monitoring changes in the current or voltage, the data processor 115 may distinguish between different layers 110(M1), 110(M2) that are being etched away, and thus may tell how much etching is occurring.

The embodiment of FIG. 8 may be combined with one or more of the above-described embodiments, if desired. An embodiment of FIG. 8 comprises a lithographic apparatus configured to project a patterned beam of radiation onto a target portion of a substrate, the apparatus comprising an etch detector 110 comprising a detector body having a secondary electron emission surface 111, the surface configured to receive a radiation flux and to emit secondary electrons due to the receipt of the radiation flux, wherein a meter 13 is connected to the detector body 110 to detect a current or voltage resulting from the secondary electron emission, wherein the composition of the detector body varies 110, measured in a direction perpendicular from the electron emission surface 111. In an embodiment, a data processor 115 is provided to detect etching of the detector 110 from the current or voltage measured by the meter 13. For example, the detector 110, meter 13 and data processor 115 may be configured like the above-described examples thereof.

In the present embodiment, since the composition of the detector body changes 110, measured in a direction perpendicular from the surface 111, etching of the surface 111 may be detected in a simple manner, real-time, for example by the data processor 115.

For example, the detector body 110 may comprise: different layers consisting of different materials; at least one (compositionally) graded layer having a gradually changing composition; different graded layers; at least one layer having a thickness of about 1 nm or less; or any combination of the above.

More particularly, the embodiment shown in FIG. 8 may comprise a multi-layer detector structure 110 and a meter 13 configured to measuring current or voltage induced by secondary electron emission from the detector surface 111. For example, as is shown in FIG. 9, the detector multi-layer structure 110 may comprise a substrate 110(S) comprising alternating layers 110(M1), 110(M2) of different materials (M1, M2), which materials (M1, M2) give a different secondary electron emission current when illuminated with the radiation R (see FIG. 8). For example, the multi-layer stack 110(M1), 110(M2) may comprise only first layers 110(M1) consisting of a first material, and second layers 110(M2) consisting of a second material that differs from the first material. It is also possible to apply more than 2 different layers. Each of the mentioned layers may be provided by one or more materials (for example a mixture). Also, as an example, the detector 110 may be provided with one or more intermediate strengthening layers (located between first and second layers 110 (M1), 110 (M2)), configured to reduce thermal expansion stress between the layers of different materials. As an example, a detector layer 110(M1), 110(M2) may comprise or consist of: a metal, carbon, Ruthenium, Molybdenum (Mo), a semiconductor, silicon, an oxide and/or other suitable materials, or any combination of the foregoing, as will be appreciated by the skilled person. In an example, the first layers may comprise silicon and the second layers comprise Molybdenum.

In an embodiment, there may be provided compositionally graded layers in the detector structure 110. Here, the concentration of a certain element may continuously change as a function of depth, particularly such that variation of secondary electron emission will occur in the case of the above-described etching of the detector structure 110 (while the same radiation flux is applied to the detector structure 110 to induce such electron emission). An advantage of such an embodiment is that it allows the etching rate to be measured more continuously.

In an embodiment, one or more optical components of the apparatus may be negatively affected by undesired etching processes, for example due to EUV induced background plasma in the system and ions emanating from the radiation source SO. As an example, ultimately, the lifetime of a radiation collector K may be limited by the etching/sputtering of ions. Thus, it is important to be able to monitor the amount of etching that occurs near the optics in the lithography tool.

For example, the etch detector 110 may be placed near one or more optical elements in the apparatus that may suffer from etching, for example in one or more of the similar positions of the detectors 10 as shown in FIGS. 1-7. For example, the sensor 110 may be placed at an above-described intermediate focus in order to monitor the expected amount of etching of a multi-layer mirror downstream of the intermediate focus. In another example, the sensor may be placed near the source SO, or within the collector K, in order to monitor the etch rate of the collector.

In an embodiment, there may be provided a multi-layer structure or stack, for example a multi-layer mirror element of a radiation collector, comprising different layers of different materials (for example a stack of silicon and Molybdenum layers), such that the different layers will provide different amounts of secondary electron emission upon exposure. In that case, following the above-described method, the amount of etching of the multi-layer collector element may be monitored in a simple manner, by detecting variation in the electron emission current or voltage due to subsequent etching away of subsequent stack layers. Particularly, it may be monitored how many of the mirror layers have already been etched away.

In the above-described embodiments, illumination/irradiation of the detector (or monitor) 10 may be direct irradiation from radiation generated by the radiation source SO of the apparatus. However, this means that the detector 10 will block some of the radiation beam, which may sometimes not be possible/acceptable. In an embodiment, the detector (or monitor) 10 is placed near the radiation beam (but not directly within the beam). Radiation that is scattered within the system may then illuminate the detector surface 11, generating secondary emission. As has been mentioned, an alternative power source may also be provided to irradiate the surface 11 of the detector 10.

In an embodiment, a vacuum may be characterized and/or controlled. For example, an EUV optical system (see FIG. 1) may be operated under optimized vacuum conditions that are currently controlled mainly by residual gas analyzer measurements. The vacuum conditions together with the illumination itself may be responsible for contamination of an optical surface, for example of a mirror surface of the above-described optics. The process of contamination of the optical surface may consist of both adsorbing of volatile and non-volatile organic and inorganic compounds and the interaction of these adsorbents at the optical surface with the incoming radiation.

In an embodiment, advantageously, a dedicated method is proposed, wherein contaminant status of an optical surface (of an above-described optical component) is checked to draw detailed conclusions on the vacuum condition under which illumination has been performed. For example, this method may be indirect, but sensitive for vacuum qualification (at least much more sensitive than a residual gas analyzing method as described above), as well as direct for checking the contamination/degradation status of the observed optic, and with this the optics mean time between cleaning and of lifetime may be determined. In this embodiment, one or more optical surfaces may be used in the vacuum environment to be checked. The one or more optical surfaces may be analyzed in situ or ex situ, for example after a certain monitoring period and desirably while being irradiated, to characterize the vacuum. The analysis may be carried out in various different ways, for example by outgassing the optic and detecting contaminants emanating from the optic and resulting from that outgassing. Another method includes determining reflectivity, in the case the optic is a mirror, or secondary electron (e.g., current) measurements.

Although specific reference may be made in this text to the use of lithographic apparatus in the manufacture of ICs, it should be understood that the lithographic apparatus and/or collector described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus configured to project a patterned beam of radiation onto a target portion of a substrate, the apparatus comprising:
   a first radiation dose detector and a second radiation dose detector, each detector comprising a secondary electron emission surface configured to receive a radiation flux and to emit secondary electrons due to the receipt of the radiation flux, the first radiation dose detector located upstream with respect to the second radiation dose detector viewed with respect to a direction of radiation transmission; and
   a meter, connected to each detector, to detect a current or voltage resulting from the secondary electron emission from the respective electron emission surface,
   wherein at least one of the radiation dose detectors is arranged separately from a surface of an optical component of the lithographic apparatus.

2. The apparatus according to claim 1, wherein the optical component of the apparatus is located between the first and second radiation dose detectors.

3. The apparatus according to claim 1, further comprising a data processor configured to compare measurement results of the meter to detect a change in radiation received by the radiation dose detectors.

4. A lithographic apparatus configured to project a patterned beam of radiation onto a target portion of a substrate, the apparatus comprising:
   a radiation dose detector substantially insensitive to a contaminant that is likely to contaminate the detector during operation of the apparatus, the detector comprising a secondary electron emission surface configured to receive a radiation flux, and which may also receive the contaminant, and to emit secondary electrons due to the receipt of the radiation flux, the surface substantially made of the contaminant or a material with a secondary electron emission similar to that of the contaminant; and
   a meter, connected to the surface, to detect a current or voltage resulting from the secondary electron emission.

5. The apparatus according to claim 4, wherein the surface is a surface of an optical component.

6. The apparatus according to claim 4, wherein the contaminant is carbon, tin, tin oxide, zinc, zinc oxide, manganese, manganese oxide, tungsten, tungsten oxide, or any combination thereof.

7. A lithographic apparatus configured to project a patterned beam of radiation onto a target portion of a substrate, the apparatus comprising:
   a radiation dose detector sensitive to a contaminant that is likely to contaminate the detector during operation of the apparatus, the detector comprising a secondary electron emission surface configured to receive a radiation flux, and which can also receive the contaminant, and to emit secondary electrons due to the receipt of the radiation flux, the detector positioned to receive a contaminant emanating from the substrate during operation; and
   a meter, connected to the detector surface, to detect a current or voltage resulting from the secondary electron emission,
   wherein the detector is arranged separately from a surface of an optical component of the lithographic apparatus.

8. The apparatus according to claim 7, further comprising:
   a projection system configured to project the patterned beam of radiation onto the substrate; and
   a gas shower configured to provide a gas curtain between the substrate and the projection system,
   wherein the detector is located between the substrate and projection system, in the gas curtain, between the gas curtain and the substrate, or between the gas curtain and the projection system.

9. The apparatus according to claim 7, further comprising a cleaning system configured to remove contamination from the detector surface.

10. A lithographic apparatus configured to project a patterned beam of radiation onto a target portion of a substrate, the apparatus comprising:
    an etch detector comprising a detector body having a secondary electron emission surface, the surface configured to receive a radiation flux and to emit secondary electrons due to the receipt of the radiation flux, wherein the composition of the detector body varies in a direction perpendicular from the surface;
    a meter, connected to the detector body, to detect a current or voltage resulting from the secondary electron emission; and
    a data processor configured to detect etching of the detector from a measurement by the meter.

11. The apparatus according to claim 10, wherein the detector body comprises different layers consisting of different materials, at least one (compositionally) graded layer having a gradually changing composition, different graded layers, at least one layer having a thickness of about 1 nm or less, or any combination thereof.

12. A lithographic method performed in a lithographic apparatus, the method comprising:
    projecting a patterned beam of radiation onto a target portion of a substrate; and
    detecting a radiation dose utilizing a radiation dose detector substantially insensitive to a contaminant that is likely to contaminate the detector during operation of the apparatus, the detector comprising a secondary electron emission surface substantially made of the contaminant or a material with a secondary electron emission similar to that of the contaminant, wherein radiation received by the surface results in emission of secondary electrons from the surface and a current or voltage resulting from the secondary electron emission is detected, the current or voltage being independent of the presence of the contaminant on the surface.

* * * * *

UNITED STATES PATENT AND TRADEMARK OFFICE
CERTIFICATE OF CORRECTION

| | | |
|---|---|---|
| PATENT NO. | : 7,629,594 B2 | |
| APPLICATION NO. | : 11/544930 | |
| DATED | : December 8, 2009 | |
| INVENTOR(S) | : Van Herpen et al. | |

It is certified that error appears in the above-identified patent and that said Letters Patent is hereby corrected as shown below:

Title page, (75) Inventor section, please delete "Yurii" and replace with Yuril

Title page, (73) Assignee section, please add Carl Zeiss SMT AG, Oberkochen, (DE)

Signed and Sealed this
Twenty-fourth Day of May, 2011

David J. Kappos
*Director of the United States Patent and Trademark Office*